(12) United States Patent
Wu

(10) Patent No.: US 6,483,383 B2
(45) Date of Patent: Nov. 19, 2002

(54) CURRENT CONTROLLED CMOS TRANSCONDUCTIVE AMPLIFIER ARRANGEMENT

(75) Inventor: Kao-Pin Wu, Hsinchu (TW)

(73) Assignee: Elan Microelectronics Corporation, Hsinchu (TW)

( * ) Notice: Subject to any disclaimer, the term of this patent is extended or adjusted under 35 U.S.C. 154(b) by 0 days.

(21) Appl. No.: 10/026,818

(22) Filed: Dec. 27, 2001

(65) Prior Publication Data
US 2002/0089378 A1 Jul. 11, 2002

(30) Foreign Application Priority Data
Jan. 5, 2001 (TW) ........................................ 90200273 U

(51) Int. Cl.[7] ................................................ H03F 3/45
(52) U.S. Cl. .................... 330/253; 330/257; 330/259; 330/261; 327/103
(58) Field of Search ................................ 330/253, 257, 330/259, 261; 327/103

(56) References Cited

U.S. PATENT DOCUMENTS

| 4,293,822 A | * | 10/1981 | McFadyen .................. 330/254 |
| 4,464,632 A | * | 8/1984 | Yoshihisa et al. ........... 330/254 |
| 5,488,330 A | * | 1/1996 | Masuoka et al. ............ 330/261 |
| 5,621,358 A | * | 4/1997 | Pisati et al. .................. 330/253 |
| 5,757,230 A | * | 5/1998 | Mangelsdorf ................ 330/133 |
| 5,812,028 A | * | 9/1998 | Adachi et al. ............... 330/261 |
| 5,880,627 A | * | 3/1999 | Thiel ........................... 327/362 |
| 5,886,579 A | * | 3/1999 | Mangelsdorf ................ 330/253 |

* cited by examiner

Primary Examiner—Michael Tokar
Assistant Examiner—Khai M. Nguyen
(74) Attorney, Agent, or Firm—Rabin & Berdo, P.C.

(57) ABSTRACT

A current controlled complementary metal-oxide-semiconductor transconductive amplifier arrangement includes a first transconductive amplifier and a control circuit to control the transconductance of the first transconductive amplifier. The control circuit contains a second transconductive amplifier and an error amplifier formed in a feedback circuit, a current source to provide a current flowing through a resistor so as to supply an input voltage for the second transconductive amplifier, and a second current source and the output of the second transconductive amplifier coupled to the positive input of the error amplifier such that the transconductance of the second transconductive amplifier is in a linear relation with its bias current. The bias current of the first transconductive amplifier is mirrored from the bias current of the second transconductive amplifier by a current mirror, thus the transconductance of the first transconductive amplifier is linearly current controlled.

2 Claims, 7 Drawing Sheets

US 6,483,383 B2

CURRENT CONTROLLED CMOS TRANSCONDUCTIVE AMPLIFIER ARRANGEMENT

FIELD OF THE INVENTION

The present invention relates generally to a transconductive amplifier, and more particularly to, a current controlled transconductive amplifier.

BACKGROUND OF THE INVENTION

As shown in FIG. 1, with an input voltage Vi a traditional transconductive amplifier has an output current Io in a relation $$Io = gm \times Vi, \quad [Eq\text{-}1]$$

where gm is the transconductance of the transconductive amplifier T1.

In a general application, such as a GM-C filter, the transconductance thereof is controlled by an input voltage and is not necessary to have a linear relation with the input voltage. While in some applications, such as a telephone, the transconductance thereof is controlled by the line current and requires a linear relation to the line current. As shown in FIG. 2, the prior art constructs a transconductive amplifier with a differential stage composed of bipolar transistors. The transconductance of a bipolar transistor is proportional to the current flowing through the bipolar transistor, as a result, linear adjustment of the current flowing through the bipolar transistor can linearly control the transconductance of the bipolar transistor, and thus requirement of linear control of the transconductance of a transconductive amplifier can be met.

However, most present integrated circuits (ICs) are formed by metal-oxide-semiconductor (MOS) processes. In consideration of the consistence of manufacture process and circuit, it is obviously that the circuit shown in FIG. 2 is unsuitable to such circumstances. Even though the integration of bipolar transistor and MOS process is available, the manufacture processes will become complex and costly. It is thus desired a MOS transconductive amplifier.

Unfortunately, there is a problem presented in the MOS transconductive amplifier for that the transconductance of a MOS transistor and the current flowing through the MOS transistor have the relation $$gm = dId/dVgs = 2Kp(W/L)(Vgs-Vt) = 2(Kp(W/L)Id)^{1/2}. \quad [Eq\text{-}2]$$

That is, the transconductance of a MOS transistor is proportional to the square root of the current flowing through the MOS transistor. Therefore, it cannot obtain a circuit with linear control of the transconductance of a MOS transconductive amplifier by current as that does in FIG. 2.

SUMMARY OF THE INVENTION

One object of the present invention is to provide a current controlled CMOS transconductive amplifier with a linear controllability of its transconductance.

A CMOS transconductive amplifier arrangement, according to the present invention, comprises a control circuit to provide a current to linearly control a first transconductive amplifier having a differential pair composed of a first and a second MOS transistors biased with a bias current, and a second transconductive amplifier matched to the first transconductive amplifier to provide an output coupled to an error amplifier and thus to form a feedback circuit to generate a current to provide the bias current for the second transconductive amplifier whose two inputs are coupled to a resistor therebetween flowing with a current provided by a first current source and output is coupled to a second current source with a current mirrored from the current of the feedback circuit by a current mirror for the bias current of the first transconductive amplifier so as to linearly control the transconductance of the first transconductive amplifier by a current.

BRIEF DESCRIPTION OF THE DRAWINGS

For a better understanding of the present invention, reference may be had to the following description of exemplary embodiments thereof, considered in conjunction with the accompanying drawings, in which.

DETAILED DESCRIPTION OF THE INVENTION

Figure 1:
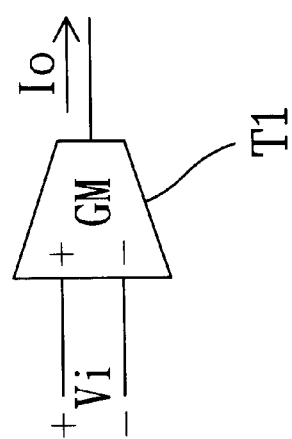
FIG. 1 is an illustrative diagram of a transconductive amplifier to show the relation between its input and output.
Figure 2:
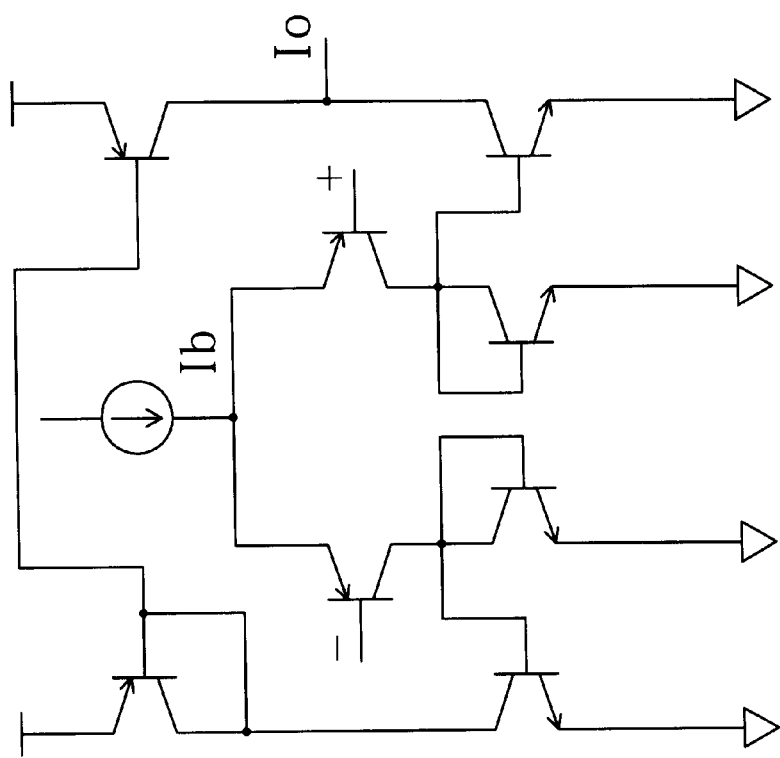
FIG. 2 is a circuit diagram of a prior art control circuit for the transconductance of a transconductive amplifier, which is constructed with bipolar transistors.
Figure 3:
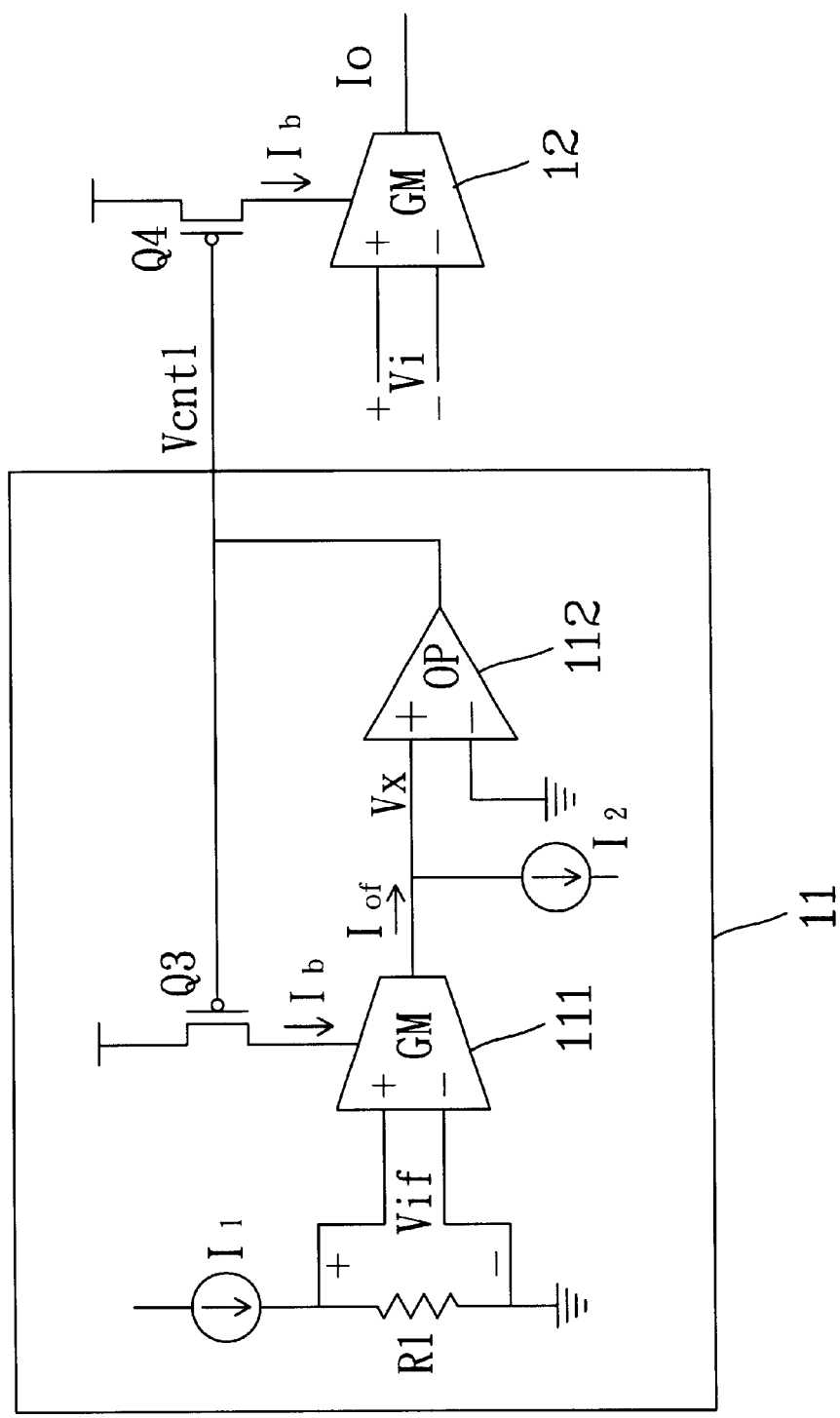
FIG. 3 is an illustrative diagram of one embodiment according to the present invention.

One embodiment according to the present invention is shown in FIG. 3, in which a control circuit 11 supplies a bias current Ib to a transconductive amplifier 12 to control the transconductance of the transconductive amplifier 12. The control circuit 11 includes a transconductive amplifier 111 and an error amplifier 112 matched to each other and formed with a negative feedback circuit. Transistors Q3 and Q4 are arranged to form a current mirror with their gates coupled to the output of the error amplifier 112 to supply the same bias currents Ib for the first transconductive amplifier 12 and the second transconductive amplifier 111. The two inputs of the transconductive amplifier 111 are connected across to a resistor R1, and the current from a current source I1 flows through the resistor R1 to produce a voltage Vif for the input of the transconductive amplifier 111 to output a current Iof. The negative input of the error amplifier 112 is grounded, and whose positive input is connected to the output of the transconductive amplifier 111 and a current source I2 is derived from therebetween.

The input voltage Vif of the transconductive amplifier 111 is given by $$Vif = I1 \times R1, \quad [Eq\text{-}3]$$

and thus the output current Iof is given by $$Iof = gm \times Vif = gm \times I1 \times R1. \quad [Eq\text{-}4]$$

The current Iof is same as the current I2 by the operation of the negative feedback circuit. For further explanation, when the current Iof is smaller than the current I2, the positive input voltage Vx of the error amplifier 112 drops down and thus the output voltage Vcntl of the error amplifier 112 also drops down, which increases the bias current Ib and thus increases the transconductance of the transconductive amplifier 111 until the current Iof equals to the current I2, that is $$I2=Iof=gm \times I1 \times R1, \qquad [Eq\text{-}5]$$

from which the transconductance of the transconductive amplifier 111 is given by $$gm=(I2/I1) \times (1/R1), \qquad [Eq\text{-}6]$$

and is related to the resistor R1 only and not affected by process parameters. By matching the transconductive amplifier 111 to the transconductive amplifier 12, the bias current Ib for the transconductive amplifier 111 is mirrored to provide the bias current for the transconductive amplifier 12 and thus makes the transconductance of transconductive amplifier 12 also to be $(I2/I1) \times (1/R1)$. In other words, a linear current control of the transconductance of the transconductive amplifier 12 is achieved by adjustment of the ratio of the current source I2 to the current source I1. Further, the transconductance of the transconductive amplifier 12 is proportional to the current source I2, it is therefore enable to linearly modulate the transconductance of the transconductive amplifier 12 by linearly modulation of the current I2.

Figure 4:
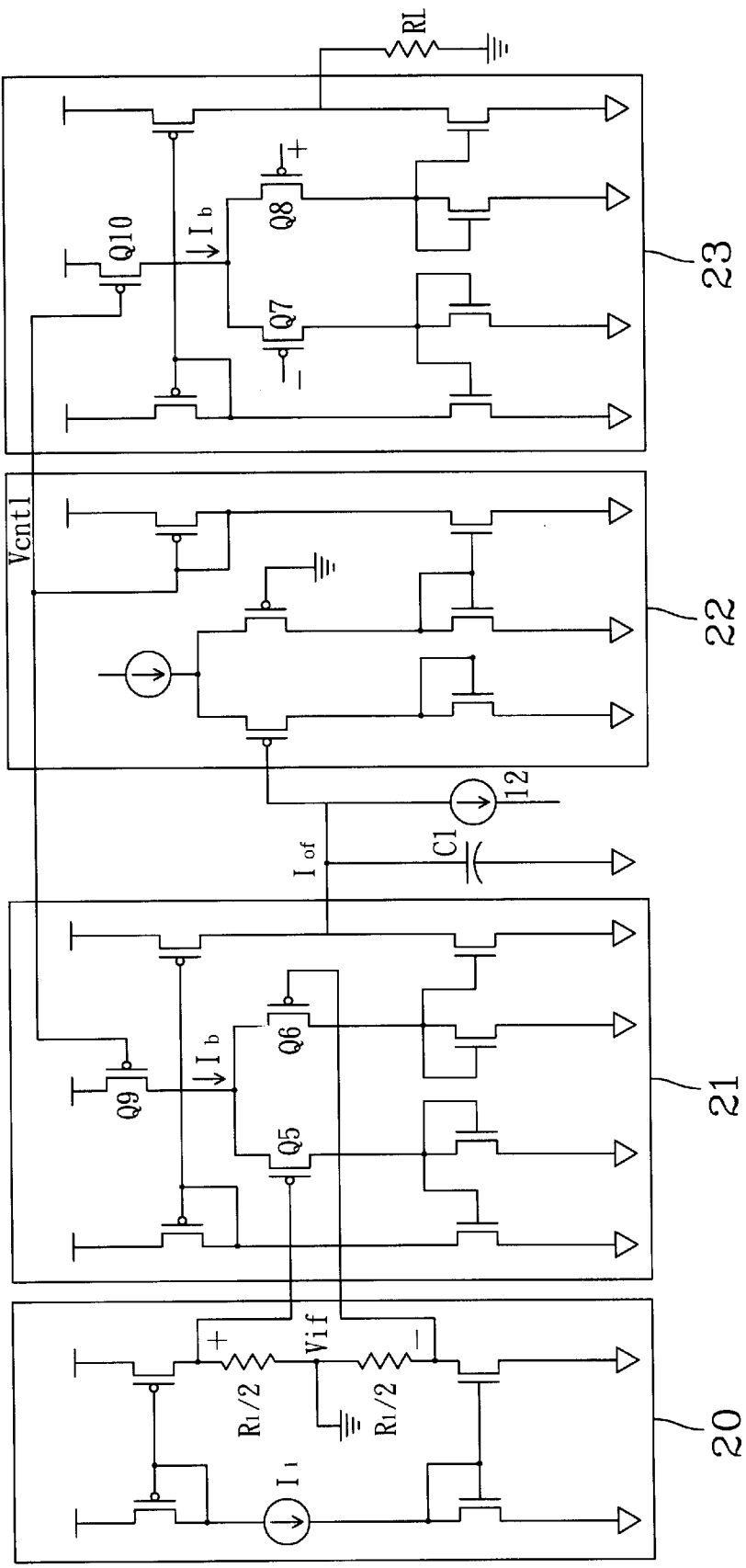
FIG. 4 is a detailed circuit diagram of an implementation of the arrangement shown in FIG. 3.

In FIG. 4 a detailed circuit diagram for implementation of the arrangement shown in FIG. 3 is further provided, in which a reference voltage 20 supplies the input voltage Vif to the transconductive amplifier 21. The reference voltage source 20 mirrors the current I1 to two serially connected resistors each having a resistance of R1/2. The transconductive amplifiers 21 and 23 are matched to each other and both includes a differential pair constructed of transistors Q5 and Q6, and Q7 and Q8 respectively. By means of the connection of the transconductive amplifier 21 to the error amplifier 22 to form a negative feedback circuit to lock the bias current Ib and the current mirror composed of transistors Q9 and Q1O, both the transconductances of the transconductive amplifiers 21 and 23 equal to $(I2/I1) \times (1/R1)$. In the circuit, the capacitor C1 is the main pole compensation capacitor and RL represents the load.

Figure 5:
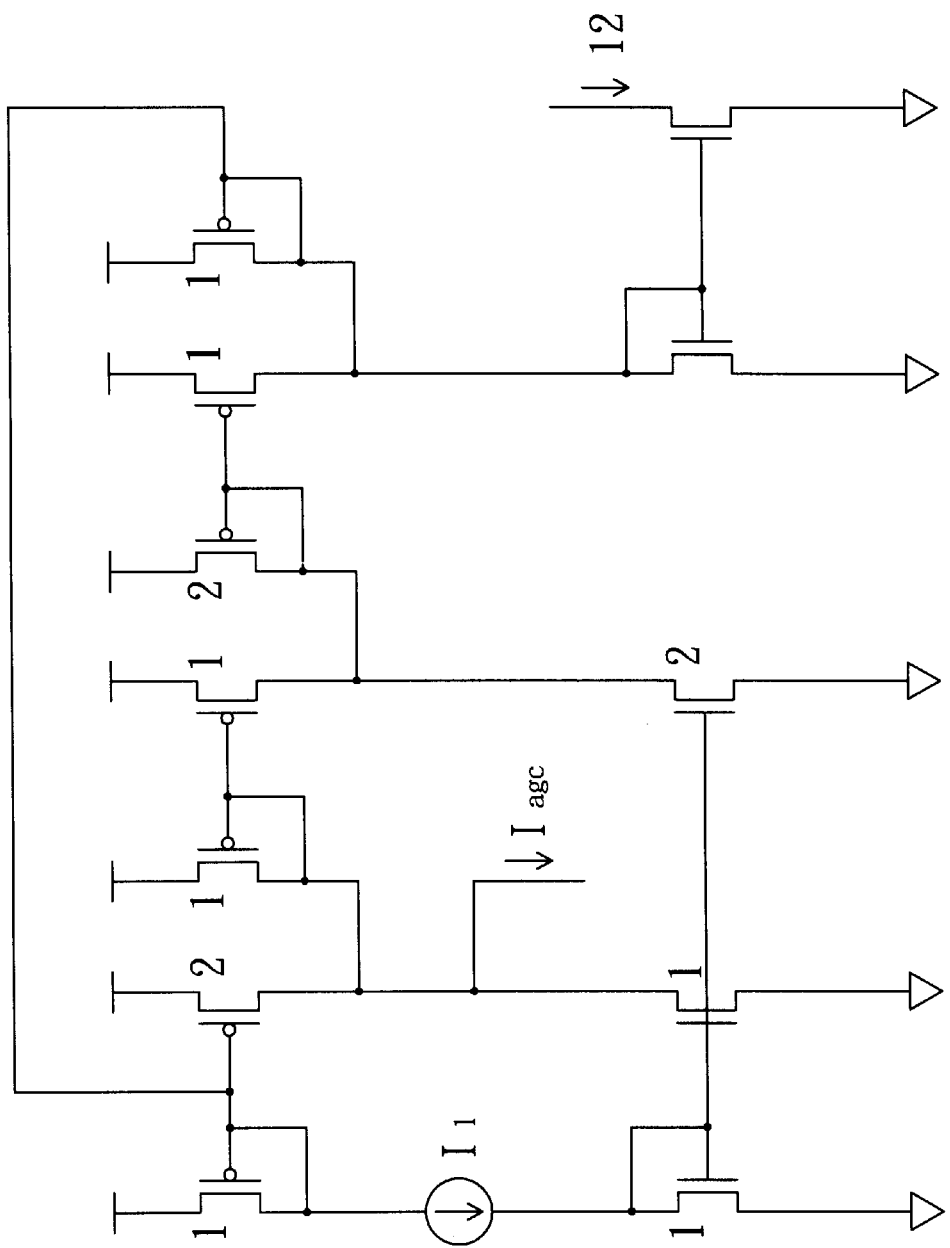
FIG. 5 is an illustrative diagram of an application in which a reference current source is generated by use of an automatic gain control current.
Figure 6:
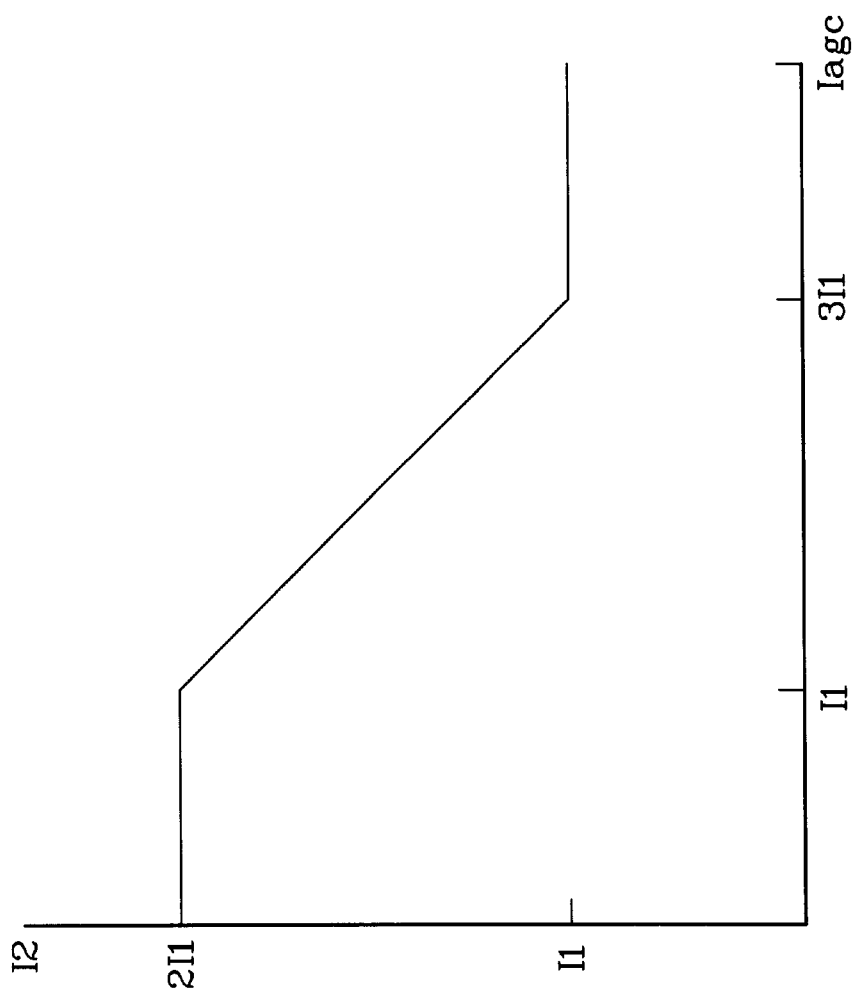
FIG. 6 is a diagram to show the relation between the automatic gain control current Iagc and the current I2 from the second current to source when the circuit shown in FIG. 5 is combined with the circuit shown in FIG. 4.

FIG. 5 provides an application control of a current source I2 by an automatic gain control current Iagc which is proportional to the line current of a telephone system. The current source I2 is adjusted by the change of the automatic gain control current Iagc, and the relationship between the auto gain control current Iagc and the current source I2 is shown in FIG. 6, in which $$I2=2 \times I1, \text{ when } 0<Iagc<I1;$$

$$I1<I2<2 \times I1, \text{ when } I1<Iagc<3 \times I1;$$

and $$I2=I1, \text{ when } Iagc>3 \times I1.$$

That is, when the magnitude of the current Iagc reduces 2×I1, the magnitude of the current I2 is changed from I1 to 2×I1, and the transconductance of the transconductive amplifier also becomes two times in the magnitude. Therefore, the transconductance of the transconductive amplifier is linearly adjusted by the automatic gain control current Iagc. The numbers besides the transistors each represents the ratio of the channel width to the channel length thereof for illustration of the current ratio between them.

Figure 7:
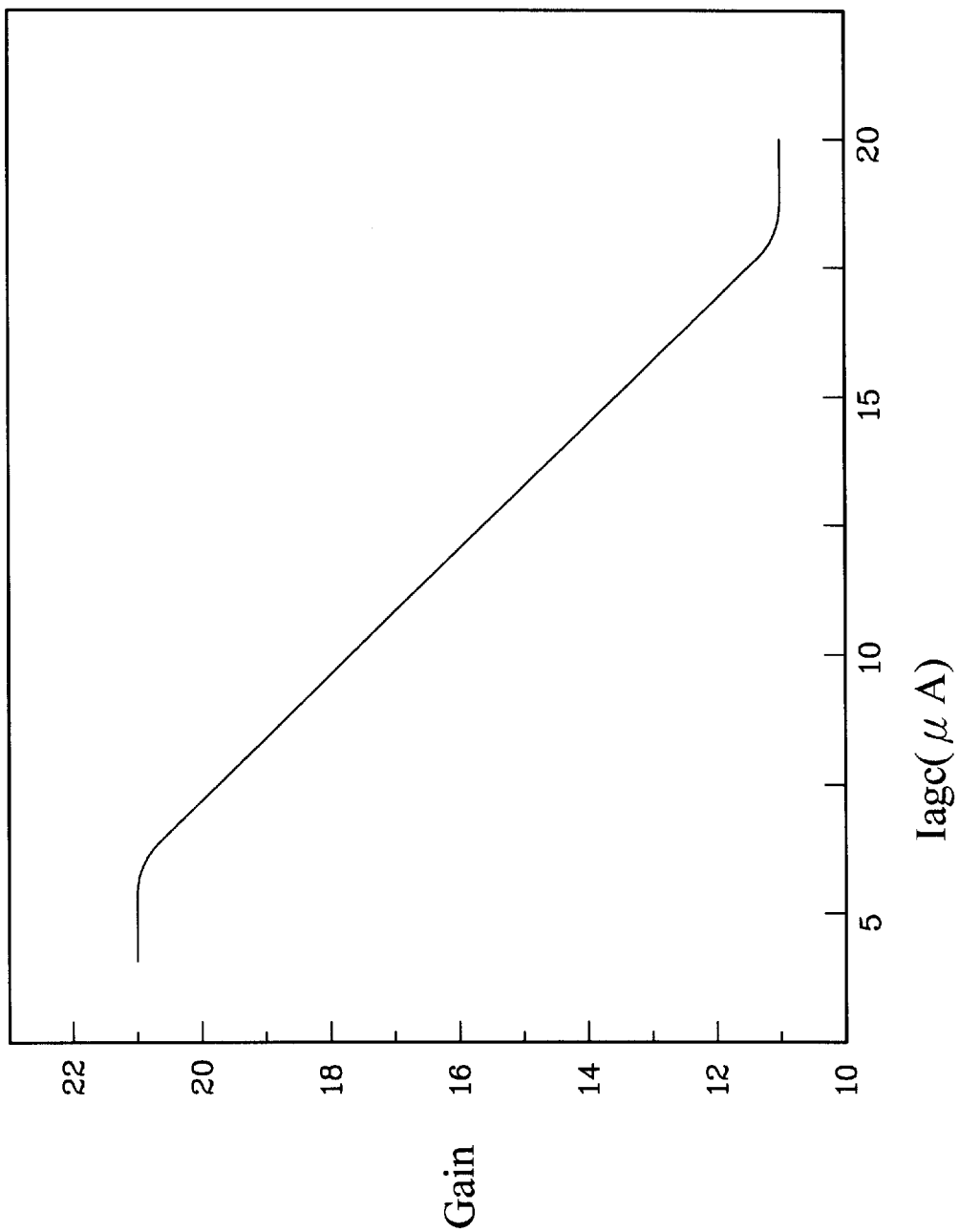
FIG. 7 is a diagram to show the relation between the automatic gain control current Iagc and the voltage gain when the circuit shown in FIG. 5 is combined with the circuit shown in FIG. 4.

When coupling the currents I1 and I2 shown in FIG. 5 to the control circuit shown in FIG. 4, a transconductive amplifier circuit with a gain controlled by a current Iagc is obtained. Under the conditions of I1=6A, R1=16.66K, and RL=68K, the relation between the auto gain control current Iagc and the voltage gain is shown in FIG. 7. In a range the auto gain control current Iagc linearly increases when the voltage gain decreases, and for the auto gain control current Iagc is proportional to the line current, the voltage gain is linearly decreased when the line current increases and linearly increased when the line current decreases, such that the signal level at the telephone receiving end remains stable.

From the above, it should be understood that the embodiments described, in regard to the drawings, are merely exemplary and that a person skilled in the art may make variations and modifications to the shown embodiments without departing from the spirit and scope of the present invention. All variations and modifications are intended to be included within the scope of the present invention as defined in the appended claims.

What is claimed is:

1. A current controlled CMOS transconductive amplifier arrangement comprising:

a first transconductive amplifier including a differential pair constructed with a first and a second MOS transistors, said differential pair applied with a first bias current;

a first current source;

a resistive element applied with said first current source;

a second transconductive amplifier matched to said first transconductive amplifier with two inputs coupled to said resistive element;

a second current source coupled to an output of said second transconductive amplifier;

an error amplifier with a positive input coupled to said output of said second transconductive amplifier and a negative input grounded, said error amplifier and second transconductive amplifier forming a feedback circuit for supplying a second bias current to said second transconductive amplifier; and a current mirror for mirroring said second bias current to said first bias current.

2. A current controlled CMOS transconductive amplifier arrangement according to claim 1, wherein said current mirror includes two MOS transistors with their gates coupled together.

* * * * *